United States Patent
Kim et al.

(10) Patent No.: US 9,842,881 B2
(45) Date of Patent: Dec. 12, 2017

(54) ELECTRONIC DEVICE INCLUDING METAL-INSULATOR-SEMICONDUCTOR STRUCTURE AND METHOD FOR FABRICATING THE SAME

(71) Applicant: SK hynix Inc., Icheon-Si (KR)

(72) Inventors: Chi-Ho Kim, Icheon-si (KR);
Jong-Han Shin, Icheon-si (KR);
Ki-Seon Park, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/340,940

(22) Filed: Nov. 1, 2016

(65) Prior Publication Data

US 2017/0294484 A1    Oct. 12, 2017

(30) Foreign Application Priority Data

Apr. 8, 2016  (KR) .................. 10-2016-0043295

(51) Int. Cl.

| | |
|---|---|
| *H01L 27/11* | (2006.01) |
| *H01L 27/24* | (2006.01) |
| *H01L 27/11507* | (2017.01) |
| *H01L 27/22* | (2006.01) |
| *H01L 29/423* | (2006.01) |
| *H01L 21/265* | (2006.01) |
| *H01L 21/28* | (2006.01) |

(Continued)

(52) U.S. Cl.
CPC .... *H01L 27/2436* (2013.01); *H01L 21/02164* (2013.01); *H01L 21/26513* (2013.01); *H01L 21/28088* (2013.01); *H01L 21/28176* (2013.01); *H01L 27/11507* (2013.01); *H01L 27/228* (2013.01); *H01L 29/4236* (2013.01); *H01L 29/4966* (2013.01)

(58) Field of Classification Search
CPC .......... H01L 27/2436; H01L 27/11507; H01L 27/228; H01L 21/02164; H01L 21/26513; H01L 21/28088; H01L 21/28176; H01L 29/4236; H01L 29/4966
USPC ......................................... 257/379
See application file for complete search history.

(56) References Cited

U.S. PATENT DOCUMENTS

| | | | |
|---|---|---|---|
| 7,589,029 B2 * | 9/2009 | Derderian ............ | C23C 16/452 438/763 |
| 2015/0132938 A1 * | 5/2015 | Ahmed ................. | H01L 29/517 438/591 |

FOREIGN PATENT DOCUMENTS

KR    10-2005-0090206 A    9/2005

OTHER PUBLICATIONS

S. Das, et al., High Performance Multilayer MoS2 Transistors with Scandium Contacts, Nano. Letters, vol. 13, p. 100-105, 2013.

(Continued)

*Primary Examiner* — Tu-Tu Ho
(74) *Attorney, Agent, or Firm* — Perkins Coie LLP

(57) ABSTRACT

A method for fabricating an electronic device that includes a metal-insulator-semiconductor (M-I-S) structure includes: providing a semiconductor layer; forming a primary insulation layer of a first thickness over the semiconductor layer; forming a reactive metal layer of a second thickness over the primary insulation layer, where the second thickness is greater than the first thickness; forming a primary capping layer of a third thickness over the reactive metal layer, where the third thickness is greater than the second thickness; and performing a thermal treatment.

20 Claims, 14 Drawing Sheets

(51) Int. Cl.
*H01L 21/02* (2006.01)
*H01L 29/49* (2006.01)

(56) References Cited

OTHER PUBLICATIONS

D. Connelly, et al., A New Route to Zero-Barrier Metal Source/Drain MOSFETs, IEEE Transactions on Nanotechnology, vol. 3, No. 1, p. 98-104, Mar. 2004.
A. Agrawal, et al., A unified model for insulator selection to form ultra-low resistivity metal-insulator-semiconductor contacts to n-Si, n-Ge, and n-InGaAs, Appl. Phys. Lett. 101, 042108, p. 1-4, 2012.
A. Agrawal, et al., Fermi level depinning and contact resistivity reduction using a reduced titania interlayer in n-silicon metal-insulator-semiconductor ohmic contacts, Appl. Phys. Lett. 104, 112101, p. 1-4, 2014.

* cited by examiner

ELECTRONIC DEVICE INCLUDING METAL-INSULATOR-SEMICONDUCTOR STRUCTURE AND METHOD FOR FABRICATING THE SAME

CROSS-REFERENCE TO RELATED APPLICATIONS

This patent document claims priority of Korean Patent Application No. 10-2016-0043295, entitled "ELECTRONIC DEVICE INCLUDING METAL-INSULATOR-SEMICONDUCTOR STRUCTURE AND METHOD FOR FABRICATING THE SAME" and filed on Apr. 8, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a metal-insulator-semiconductor structure having a low contact resistance, and a method for fabricating the same.

In an implementation, a method for fabricating an electronic device that includes a metal-insulator-semiconductor (M-I-S) structure includes: providing a semiconductor layer; forming a primary insulation layer of a first thickness over the semiconductor layer; forming a reactive metal layer of a second thickness over the primary insulation layer, where the second thickness is greater than the first thickness; forming a primary capping layer of a third thickness over the reactive metal layer, where the third thickness is greater than the second thickness; and performing a thermal treatment.

Implementations of the above method may include one or more of the following.

The second thickness may be approximately two to four times as thick as the first thickness. The second thickness may be approximately three times as thick as the first thickness. The primary capping layer may include a metal nitride. The primary capping layer may include a nitride of a metal which is the same as a metal included in the reactive metal layer. The forming of the reactive metal layer and the forming of the primary capping layer may be performed in-situ. In the performing of the thermal treatment, the primary insulation layer may be changed into an insulation layer that further includes a metal of the reactive metal layer. The primary insulation layer may include an insulation material that satisfies stoichiometry, and the insulation layer may include an insulation material that does not satisfy stoichiometry. The thickness of the insulation layer may be decreased from the first thickness of the primary insulation layer. In the performing of the thermal treatment, the primary capping layer may be changed into a capping layer that further includes a metal of the reactive metal layer. The thickness of the capping layer may be increased from the third thickness of the primary capping layer. The semiconductor layer may include silicon, and the primary insulation layer may include a silicon oxide, and the reactive metal layer may include titanium, and the primary capping layer may include a titanium nitride. The method may further include: forming a gate electrode that is isolated from the semiconductor layer by a gate dielectric layer, where the gate electrode is disposed over the semiconductor layer or at least a portion of the gate electrode is buried in the semiconductor layer, after the providing of the semiconductor layer; and forming a junction region by implanting an impurity into the semiconductor layer that is exposed by the gate electrode, wherein the primary insulation layer, the reactive metal layer, and the primary capping layer are formed over the junction region. The method may further include: forming a memory device that is coupled with the primary capping layer over the primary capping layer. The memory device may include a Magnetic Tunnel Junction (MTJ) which includes: a pinned layer having a fixed magnetization direction; a free layer having a variable magnetization direction; and a tunnel barrier layer interposed between the pinned layer and the free layer.

In another implementation, a method for fabricating an electronic device that includes a metal-insulator-semiconductor (M-I-S) structure includes: providing a semiconductor layer; forming a primary insulation layer over the semiconductor layer; forming a reactive metal layer that is approximately two to four times as thick as the primary insulation layer over the primary insulation layer; forming a primary capping layer over the reactive metal layer; and performing a thermal treatment.

Implementations of the above method may include one or more of the following.

The primary capping layer may be thicker than the reactive metal layer. The primary capping layer may include a metal nitride. The primary capping layer may include a nitride of a metal which is the same as a metal included in the reactive metal layer. The forming of the reactive metal layer and the forming of the primary capping layer may be performed in-situ.

In another implementation, an electronic device includes: a metal-insulator-semiconductor (M-I-S) structure that includes: a semiconductor layer; an insulation layer disposed over the semiconductor layer and including a metal; and a conductive layer disposed over the insulation layer and including the same metal as the metal included in the insulation layer.

Implementations of the above electronic device may include one or more of the following.

The conductive layer may include a metal nitride. The conductive layer may include a nitride of the same metal included in the insulation layer. A metal-semiconductor compound may not exist between the semiconductor layer and the insulation layer and between the semiconductor layer and the conductive layer. The semiconductor layer may include silicon, and the insulation layer may include a silicon oxide including titanium, and the conductive layer may include a titanium nitride. The titanium inside the insulation layer may exist in a form of an oxide that does not satisfy stoichiometry. The electronic device may further include: a transistor, which includes: a gate electrode that is coupled with the semiconductor layer with a gate dielectric layer therebetween; a junction region that is formed inside the semiconductor layer on one side of the gate electrode; and a stacked structure of the insulation layer and the conductive layer that is coupled with the junction region over the junction region. The electronic device may further include: a memory device that is coupled with the stacked structure over the stacked structure. The memory device may include a Magnetic Tunnel Junction (MTJ) which includes: a pinned layer having a fixed magnetization direction; a free layer having a variable magnetization direction; and a tunnel barrier layer interposed between the pinned layer and the free layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the metal-insulator-semiconductor structure is a part of at least one of the control unit, the operation unit and the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the metal-insulator-semiconductor structure is a part of at least one of the core unit, the cache memory unit and the bus interface in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the metal-insulator-semiconductor structure is a part of at least one of the processor, the auxiliary memory device, the main memory device and the interface device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the metal-insulator-semiconductor structure is a part of at least one of the controller, the storage device, the temporary storage device and the interface in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the metal-insulator-semiconductor structure is a part of at least one of the memory controller, the memory, the buffer memory and the interface in the memory system.

These and other aspects, implementations and associated advantages are described in greater detail in the drawings, the description and the claims.

DETAILED DESCRIPTION

Figure 1:
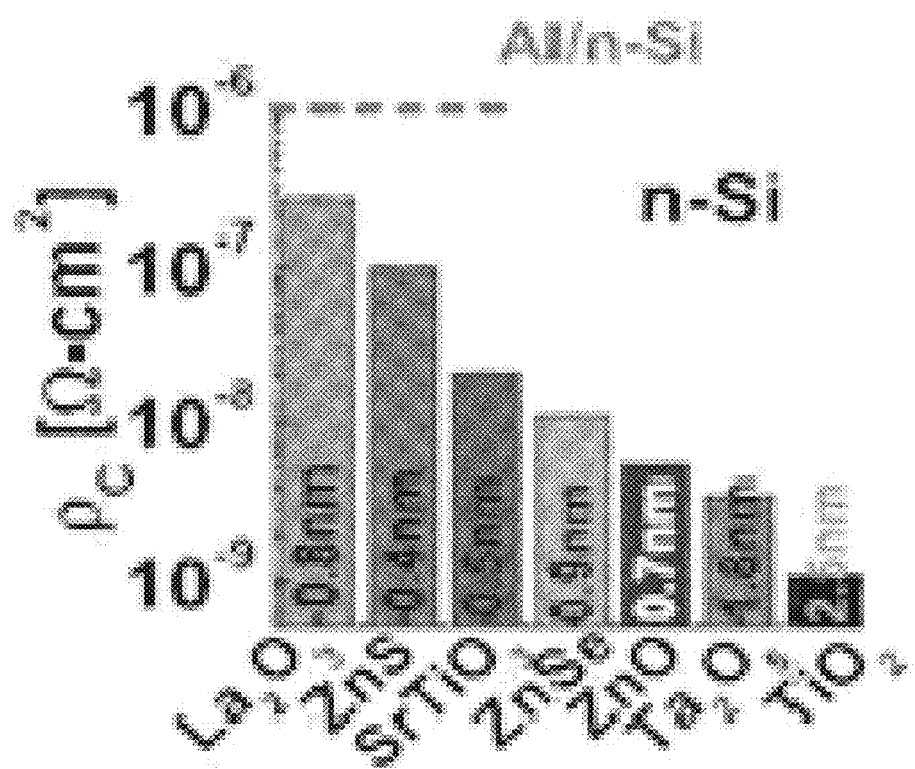
FIG. 1 is a graph comparing contact resistances of a metal-insulator-semiconductor (M-I-S) structure and a metal-semiconductor (M-S) structure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A semiconductor memory may include a cell array where a plurality of memory cells for storing data are arrayed. Each of the memory cells may include a memory element for storing data and an access element for controlling an access to the memory element. As for the memory element, a resistive variable device that switches between a high-resistance state and a low-resistance state according to the voltage or current applied thereto may be used. As for the access element, a transistor may be used.

When a resistive variable device requiring a high switching current, such as a Magnetic Random Access Memory (MRAM) and a Spin Transfer Torque Magnetic Random Access Memory (STT-MRAM), is used as the memory element, the driving current for a transistor needs to be high accordingly. To obtain the high driving current for a transistor, it is important to decrease the contact resistance between a semiconductor substrate and metal lines.

In a typical structure of metal-semiconductor (M-S) where a semiconductor substrate directly contacts metal lines, it is difficult to sufficiently decrease the contact resistance due to a Fermi-Level-Pinning (FLP) phenomenon although the concentration of a dopant inside the semiconductor substrate increases.

Figure 2:
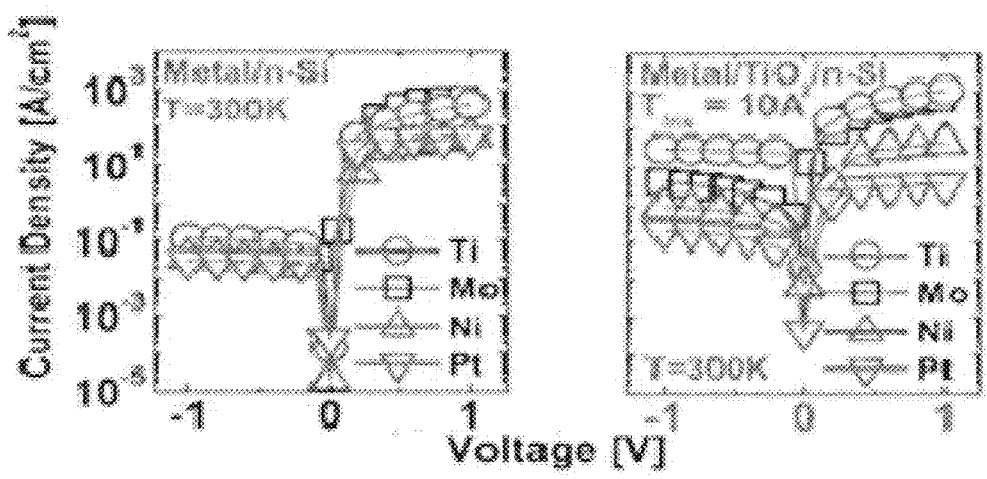
FIG. 2 shows graphs comparing driving currents of a metal-insulator-semiconductor (M-I-S) structure and a metal-semiconductor (M-S) structure.

To address the problem, a metal-insulator-semiconductor (M-I-S) structure where a thin insulation layer is interposed between a semiconductor substrate and a metal contact has been suggested, and experiments have revealed that the M-I-S structure has a lower contact resistance than the M-S structure and accordingly has a higher driving current than the M-S structure (see FIGS. 1 and 2). In the M-I-S structure, the "metal" may include a material including metal. For example, the "metal" may include not only pure metal but also metal nitrides and the like.

FIG. 1 is a graph comparing contact resistances of a metal-insulator-semiconductor (M-I-S) structure and a metal-semiconductor (M-S) structure with each other. In FIG. 1, Al/n-Si is used as the exemplary M-S structure and an M-I-S structure is configured by interposing an insulation material, such as $La_2O_3$, ZnS, $SrTiO_3$, ZnSe, ZnO, $Ta_2O_5$ or $TiO_2$, between Al and n-Si.

Referring to FIG. 1, it may be seen that the contact resistance of the M-S structure is greater than that of the M-I-S structure.

FIG. 2 shows graphs comparing driving currents of a metal-insulator-semiconductor (M-I-S) structure and a metal-semiconductor (M-S) structure with each other. The graph on the left side of FIG. 2 exemplarily shows the driving current of the M-S structure, which is a stacked structure of n-Si and a metal such as titanium (Ti), molybdenum (Mo), nickel (Ni) or platinum (Pt). The graph on the right side of FIG. 2 exemplarily shows the driving current of the M-I-S structure where $TiO_2$ is interposed as an insulation material between n-Si and a metal such as titanium (Ti), molybdenum (Mo), nickel (Ni) or platinum (Pt).

FIG. 2 shows that the driving current of the M-I-S structure is higher than that of the M-S structure.

The experimental results of FIGS. 1 and 2 are obtained from the experiments that are performed by sequentially depositing a semiconductor, an insulator and a metal without a thermal treatment at a high temperature. The thermal treatment at a high temperature is frequently used in diverse fabrication processes such as a process of enabling transistor junctions. When a thermal treatment is performed at a high temperature after the M-I-S structure is formed as above, there is a problem in that a metal silicide is formed on the interface between the metal and a semiconductor substrate due to a reaction between the metal and the semiconductor substrate and the metal silicide may be agglomerated. This agglomeration of metal silicide can substantially break the M-I-S structure.

Figure 3:
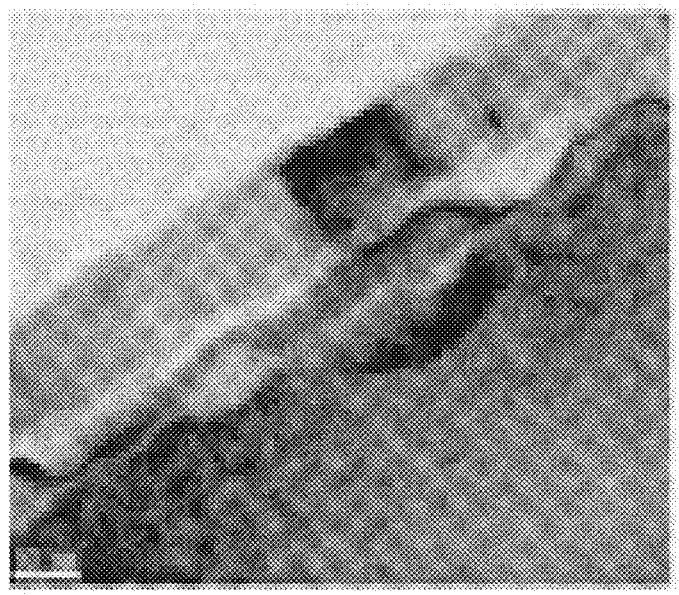
FIG. 3 is a photograph showing undesired agglomeration occurring in an M-I-S structure during a thermal treatment at a high temperature.

FIG. 3 is a photograph showing such undesired agglomeration in the M-I-S structure during a thermal treatment at a high temperature. FIG. 3 shows an experimental result obtained by sequentially depositing a thin $TiO_2$ layer and a thick Ti layer on an n-Si substrate and performing a thermal treatment at approximately 700° C.

It may be seen from FIG. 3 that $TiSi_x$ is agglomerated between Ti and the Si substrate.

Since the polycrystalline metal silicide increases the diffusion of a dopant, the loss of the dopant from the inside of the semiconductor substrate may be increased, thereby increasing the contact resistance.

To solve this problem, it is desirable to prevent the formation of a metal silicide between a metal and a semiconductor substrate after the thermal treatment at a high temperature and thereby substantially maintain the desired M-I-S structure. The disclosed technology can suppress the formation of a metal silicide between a metal and a semiconductor substrate after a thermal treatment at a high temperature and thereby provides a transistor with a low contact resistance and a high driving current, and a method for fabricating the transistor. This will be described in detail, hereafter, by referring to the accompanying drawings.

Figure 4A:
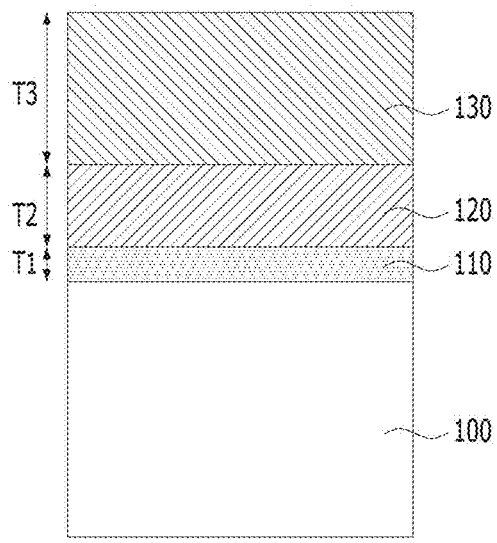
FIGS. 4A and 4B are cross-sectional views illustrating an M-I-S structure and a method for fabricating the M-I-S structure in accordance with an implementation.
Figure 4B:
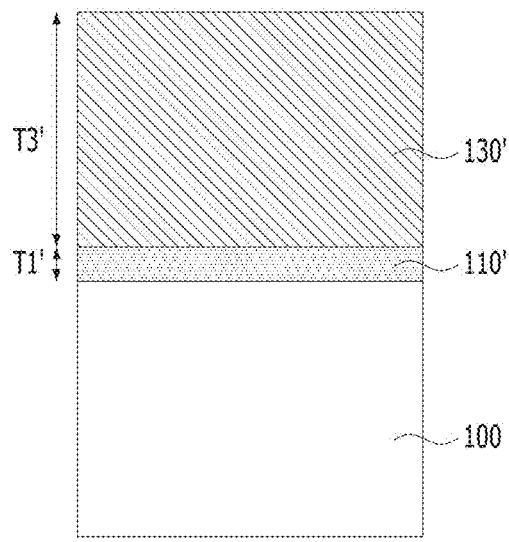

FIGS. 4A and 4B are cross-sectional views illustrating an M-I-S structure and a method for fabricating the M-I-S structure in accordance with an implementation.

Referring to FIG. 4A, a semiconductor layer 100 may be provided. The semiconductor layer 100 may include diverse semiconductor materials such as silicon (Si). The semiconductor layer 100 may include an impurity doped thereon to decrease the resistance on the interface with a layer that is formed on the upper portion of the semiconductor layer 100. The higher the concentration of the impurity doped on the semiconductor layer 100 becomes, the lower the interface resistance is.

Subsequently, a primary insulation layer 110 may be formed over the semiconductor layer 100. The primary insulation layer 110 may be relatively thin. For example, the thickness of the primary insulation layer 110 may range from several Å to tens of Å. Furthermore, the primary insulation layer 110 may have a thickness of approximately 10 Å. The thickness of the primary insulation layer 110 is denoted by a reference sign T1. The primary insulation layer 110 may include a silicon oxide that satisfies stoichiometry, such as $SiO_2$, or a metal oxide that satisfies stoichiometry, such as $TiO_2$.

Subsequently, a reactive metal layer 120 may be formed over the primary insulation layer 110. The reactive metal layer 120 is a layer capable of reacting with the primary insulation layer 110 and a primary capping layer 130, which will be described later. The reactive metal layer 120 may include a metal substance such as titanium (Ti). The thickness T2 of the reactive metal layer 120 may be thicker than the thickness T1 of the primary insulation layer 110 (T1<T2). Furthermore, the thickness T2 of the reactive metal layer 120 may be controlled such that the reactive metal layer 120 does not substantially react with the semiconductor layer 100 and thereby not form a metal-semiconductor compound, such as a metal silicide. The thickness T2 of the reactive metal layer 120 that satisfies the conditions may range from approximately two to four times as thick as the thickness T1 of the primary insulation layer 110. According to an implementation, the thickness T2 of the reactive metal layer 120 may be approximately three times as thick as the thickness T1 of the primary insulation layer 110. When the primary insulation layer 110 has a thickness of approximately 10 Å, the reactive metal layer 120 may have a thickness of approximately 20 Å to approximately 40 Å. According to an implementation, the reactive metal layer 120 may have a thickness of approximately 30 Å. Under the condition of the thickness T2, it is experimentally confirmed that a metal silicide is not formed and thus the impurity loss of the semiconductor layer 100 is decreased and the contact resistance is improved. This will be described below in detail with reference to FIGS. 5 to 7.

Subsequently, a primary capping layer 130 may be formed over the reactive metal layer 120. The primary capping layer 130 may protect the reactive metal layer 120 from being oxidized or having changed physical properties in the subsequent process. The primary capping layer 130 may include a metal nitride the state of which is relatively more stable than the state of a metal. Furthermore, the primary capping layer 130 may include a nitride of a metal included in the reactive metal layer 120. For example, when the reactive metal layer 120 includes titanium (Ti), the primary capping layer 130 may include a titanium nitride (TiN). When the reactive metal layer 120 and the primary capping layer 130 include the same metal, the reactive metal layer 120 and the primary capping layer 130 may be formed through in-situ deposition, thus decreasing the cost and time taken for the fabrication process. The thickness T3 of the primary capping layer 130 may be thicker than the thickness T1 of the primary insulation layer 110 and the thickness T2 of the reactive metal layer 120. For example, the thickness T3 of the primary capping layer 130 may be approximately ten times as thick as the thickness T1 of the primary insulation layer 110.

Referring to FIG. 4B, a thermal treatment may be performed on the resultant structure of the process of FIG. 4A. The thermal treatment may be performed to activate the impurity doped in the semiconductor layer 100, and it may be performed at a relatively high temperature, e.g., hundreds of Celsius degrees (° C.).

As a result of the thermal treatment at the high temperature, the metal substance of the reactive metal layer 120 may diffuse into the primary insulation layer 110 so as to form an insulation layer 110'. The insulation layer 110' may include an insulation material including the metal of the reactive metal layer 120. Accordingly, the insulation layer 110' may include the metal included in the reactive metal layer 120 and an element included in the primary insulation layer 110, for example, a combination structure of silicon and oxygen, or the metal and oxygen. When the primary insulation layer 110 includes a silicon oxide or a metal oxide that satisfies stoichiometry, the metal diffused from the reactive metal layer 120 may be bonded with the oxygen in the inside of the primary insulation layer 110. Therefore, the insulation layer 110' may include a silicon oxide or a metal oxide that has less oxygen than the amount of oxygen that is required stoichiometrically. To take an example, when the reactive metal layer 120 includes titanium (Ti) and the primary insulation layer 110 includes silicon dioxide ($SiO_2$), the insulation layer 110' may include a structure of Ti—Si—O. Furthermore, the titanium oxide or the silicon oxide in the inside of the insulation layer 110' may have less oxygen than the amount of oxygen required stoichiometrically. In other words, the titanium oxide or the silicon oxide in the inside of the insulation layer 110' may be or include $TiO_x$ where "x" is smaller than 2, or $SiO_y$ where "y" is smaller than 2. The thickness T1' of the insulation layer 110' may be decreased from the thickness T1 of the primary insulation layer 110.

As described above, if the thicknesses of the primary insulation layer 110 and the reactive metal layer 120 are properly controlled, although the reactive metal layer 120 reacts with the primary insulation layer 110, the metal substance may be suppressed from being excessively diffused. Thus, it is possible to suppress and/or minimize the reaction with the semiconductor layer 100. Therefore, with the presence of the insulation layer 110', the formation of the metal silicide between the reactive metal layer 120 and the semiconductor layer 100 may be suppressed and/or minimized.

Also, as a result of the thermal treatment, the metal substance of the reactive metal layer 120 may diffuse into the primary capping layer 130, or a metal nitride of the primary capping layer 130 may diffuse into the reactive metal layer 120. In other words, the reactive metal layer 120 and the primary capping layer 130 may be mixed together so as to be indistinguisable from each other, and thereby a capping layer 130' may be formed. The capping layer 130' may include a combination structure including a metal included in the reactive metal layer 120 and an element, such as a metal and nitrogen, included in the primary capping layer 130. When the metal included in the reactive metal layer 120 is the same as the metal included in the primary capping layer 130, the capping layer 130' may include substantially the same metal nitride as that of the primary capping layer 130. To take an example, when the reactive metal layer 120 includes titanium (Ti) and the primary capping layer 130 includes titanium nitride (TiN), the capping layer 130' may include titanium nitride (TiN). The thickness T3' of the capping layer 130' may be increased from the thickness T3 of the primary capping layer 130.

As described above, although the reactive metal layer 120 reacts with the primary capping layer 130, the material included in the primary capping layer 130 may diffuse into the primary insulation layer 110 and prevent the reaction with the semiconductor layer 100 if the insulation layer 110' is maintained.

In the process where the reactive metal layer 120 reacts with the primary insulation layer 110 and/or the primary capping layer 130, the reactive metal layer 120 may be removed substantially. Although not shown, according to another implementation, the reactive metal layer 120 may remain in a very thin thickness between the insulation layer 110' and the capping layer 130'.

According to the above-described process, a metal silicide may not be formed between the semiconductor layer 100 and the insulation layer 110' and/or between the semiconductor layer 100 and the capping layer 130'. In this way, the semiconductor layer 100 may be protected from losing the impurity, which eventually improves the contact resistance of the M-I-S structure of the implement of the present disclosure. This is revealed in the experimental results of FIGS. 5 to 7.

Figure 5:
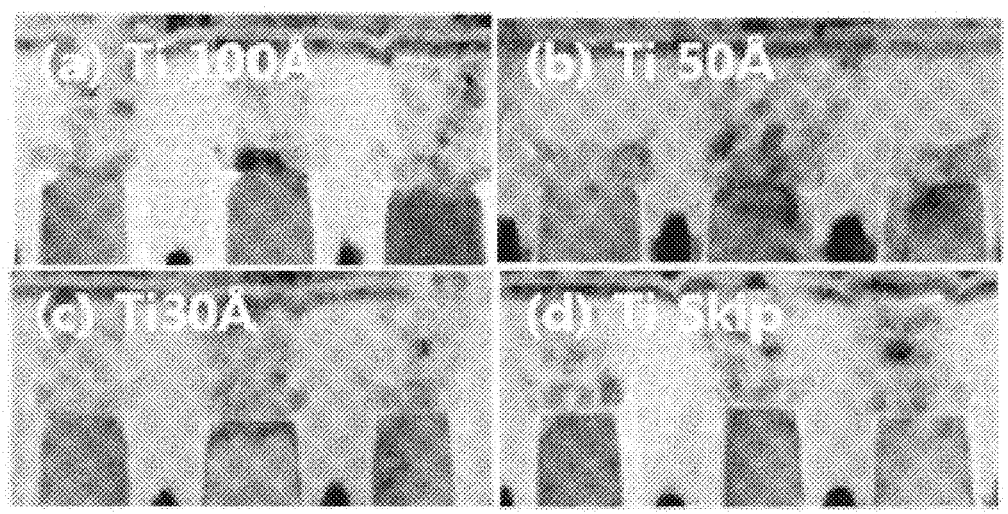
FIG. 5 shows photographs showing whether a metal silicide is formed or not according to the thickness of a reactive metal layer when the M-I-S structure is fabricated in accordance with the implementation of FIGS. 4A and 4B.

FIG. 5 shows photographs showing the formation of a metal silicide depending on the thickness of a reactive metal layer when the M-I-S structure is fabricated in accordance with the implementation of FIGS. 4A and 4B. FIG. 5 shows cross-sections of the resultant structures obtained by forming a silicon dioxide ($SiO_2$) layer as the primary insulation layer 110 in the thickness of approximately 10 Å over a silicon (Si) layer, forming a titanium (Ti) layer as the reactive metal layer 120 in the thicknesses variation of approximately 100 Å, 50 Å, 30 Å and 0 Å over the silicon dioxide ($SiO_2$) layer, forming a titanium nitride (TiN) layer as the primary capping layer 130 in a thickness of approximately 100 Å over the titanium (Ti) layer, and performing a thermal treatment at a high temperature.

Referring to the photographs of (a) 100 Å-Ti layer and (b) 50 Å-Ti layer of FIG. 5, it may be seen that a metal silicide is agglomerated on the interface with the silicon (Si) layer when the titanium (Ti) layer is formed in a thickness of approximately 100 Å and 50 Å.

Conversely, the photograph of (c) 30 Å-Ti layer of FIG. 5 shows that the metal silicide is not agglomerated on the interface with the silicon (Si) layer when the titanium (Ti) layer of approximately 30 Å is formed. This may be substantially the same as the case of (d) Ti-skip where a titanium (Ti) layer is not formed.

Consequently, it may be seen that a metal silicide is not formed when a titanium (Ti) layer has a thickness of more or less 30 Å or approximately 30 Å or less.

Figure 6:
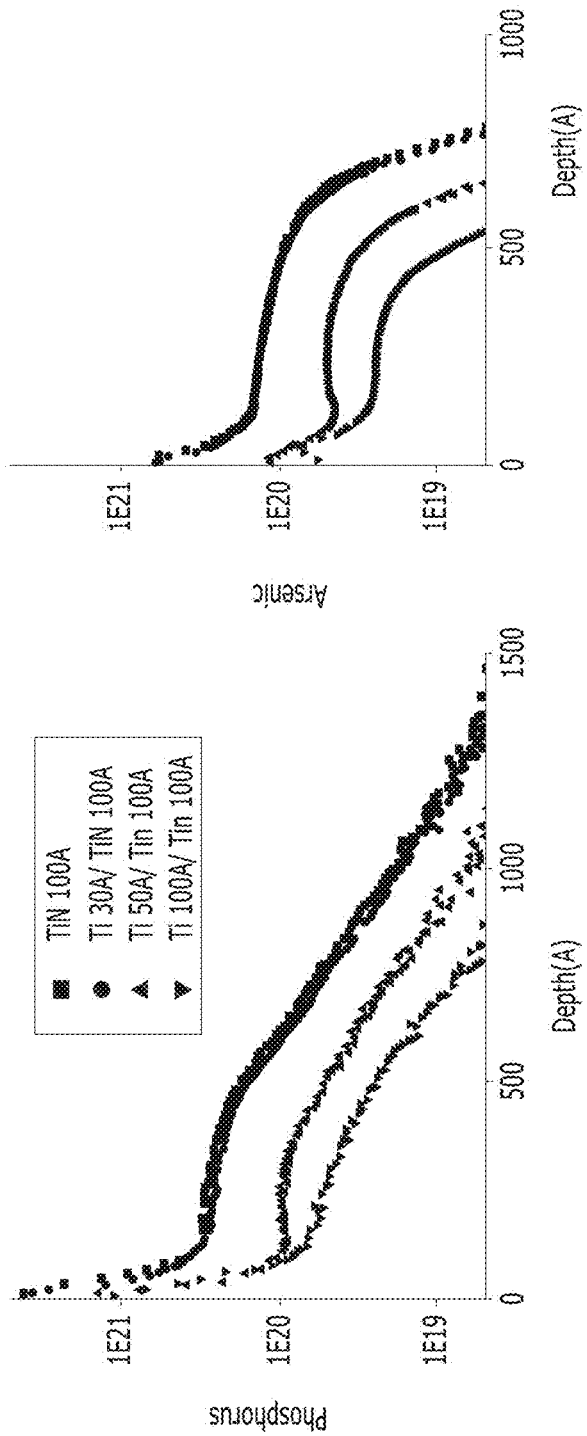
FIG. 6 shows measurements showing the extent of impurity loss of a semiconductor layer according to the thickness of the reactive metal layer when the M-I-S structure is fabricated in accordance with the implementation of FIGS. 4A and 4B.

FIG. 6 shows graphs showing the extent of impurity loss of the semiconductor layer according to the thickness of the reactive metal layer when the M-I-S structure is fabricated in accordance with the implementation of FIGS. 4A and 4B. FIG. 6 shows the amount of the impurity of the silicon (Si) layer of the resultant structure obtained by forming a silicon dioxide ($SiO_2$) layer as the primary insulation layer 110 in a thickness of approximately 10 Å over a silicon (Si) layer, forming a titanium (Ti) layer as the reactive metal layer 120 in the thicknesses variation of approximately 100 Å, 50 Å, 30 Å and 0 Å over the silicon dioxide ($SiO_2$) layer, forming a titanium nitride (TiN) layer as the primary capping layer 130 in a thickness of approximately 100 Å over the titanium (Ti) layer, and performing a thermal treatment at a high temperature.

Referring to FIG. 6, it may be seen that the concentration of the impurity of the silicon (Si) layer, which is phosphorus (P) or arsenic (As), is lower when the titanium (Ti) layers of approximately 100 Å and 50 Å are formed than when the titanium (Ti) layer of approximately 30 Å is formed. In other words, the impurity of the silicon (Si) layer is lost more when the titanium (Ti) layers of approximately 100 Å and 50 Å are formed than when the titanium (Ti) layer of approximately 30 Å is formed. The extent of the impurity loss from the silicon (Si) layer when the titanium (Ti) layer of approximately 30 Å is formed is substantially the same as the case where a titanium (Ti) layer is not formed.

Consequently, it may be seen that the impurity loss of the silicon (Si) layer is minimized when the titanium (Ti) layer has a thickness of more or less 30 Å or approximately 30 Å or less.

Figure 7:
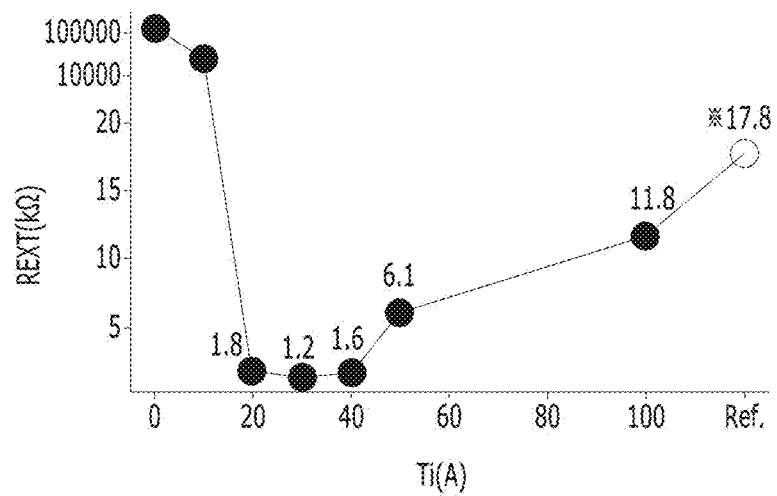
FIG. 7 shows graphs showing contact resistance according to the thickness of the reactive metal layer when the M-I-S structure is fabricated in accordance with the implementation of FIGS. 4A and 4B.

FIG. 7 shows graphs showing contact resistance according to the thickness of the reactive metal layer when the M-I-S structure is fabricated in accordance with the implementation of FIGS. 4A and 4B. FIG. 7 shows the contact resistance of the resultant structure obtained by forming a silicon dioxide ($SiO_2$) layer as the primary insulation layer 110 in a thickness of approximately 10 Å over a silicon (Si) layer, forming a titanium (Ti) layer as the reactive metal layer 120 in the thicknesses of approximately 0 Å to 100 Å or more over the silicon dioxide ($SiO_2$) layer, forming a titanium nitride (TiN) layer as the primary capping layer 130 in a thickness of approximately 100 Å over the titanium (Ti) layer, and performing a thermal treatment at a high temperature.

Referring to FIG. 7, it may be seen that the contact resistance is the smallest when the thickness of the titanium (Ti) layer is approximately 30 Å. Even when the thickness of the titanium (Ti) layer is approximately 20 Å or 40 Å, it may be seen that the contact resistance is substantially very small.

When the thickness of the titanium (Ti) layer becomes greater than approximately 40 Å, it is observed that the contact resistance is raised dramatically, which is understood to result from agglomeration of a metal silicide and/or increasing impurity loss of the silicon (Si) layer, as described above with reference to FIGS. 5 and 6.

On the other hand, when the thickness of the titanium (Ti) layer becomes smaller than approximately 20 Å, the contact resistance is observed to increase drastically as well. This surge in the contact resistance may not originate from the same reason shown in FIGS. 5 and 6, because the agglomeration of the metal silicide and/or the impurity loss of the silicon (Si) layer are decreased as the thickness of the titanium (Ti) layer becomes smaller. It is understood that the contact resistance is increased because the decreased thickness of the titanium (Ti) layer makes the nitrogen of the titanium nitride (TiN) layer in the upper portion of the titanium (Ti) layer diffuse more and react more with the silicon (Si) layer so as to form an insulation material such as a silicon nitride (SiN) on the interface.

Therefore, it may be seen that the contact resistance may be minimized when the thickness of the titanium (Ti) layer ranges from approximately 20 Å to approximately 40 Å.

Referring to FIGS. 5 to 7 together, when the M-I-S structure is fabricated in accordance with the implementation of FIGS. 4A and 4B, it is desirable to control the thickness of the reactive metal layer 120 to be approximately two to four times as thick as the primary insulation layer 110 in order to reduce the contact resistance. Furthermore, according to another implementation of the present disclosure, it is desirable to control the thickness of the reactive metal layer 120 to be approximately three times as thick as the primary insulation layer 110.

Meanwhile, the M-I-S structure may be used to form a contact of a transistor and fabricate a semiconductor memory including the transistor. Hereafter, this will be described below with reference to FIGS. 8A to 9.

FIGS. 8A to 8D are cross-sectional views illustrating a transistor and a method for fabricating the transistor in accordance with an implementation. FIG. 8E is a cross-sectional view illustrating a semiconductor memory including the transistor of FIG. 8D. FIG. 9 is a plan view of the semiconductor memory shown in FIG. 8E. The cross-sections of FIGS. 8A to 8E are obtained by cutting a line A-A' of FIG. 9.

Figure 8A:
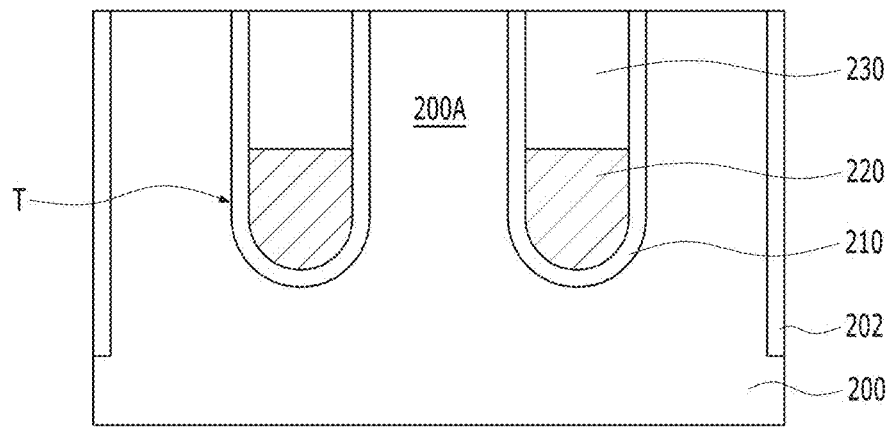
FIGS. 8A to 8D are cross-sectional views illustrating a transistor and a method for fabricating the transistor in accordance with an implementation.
Figure 9:
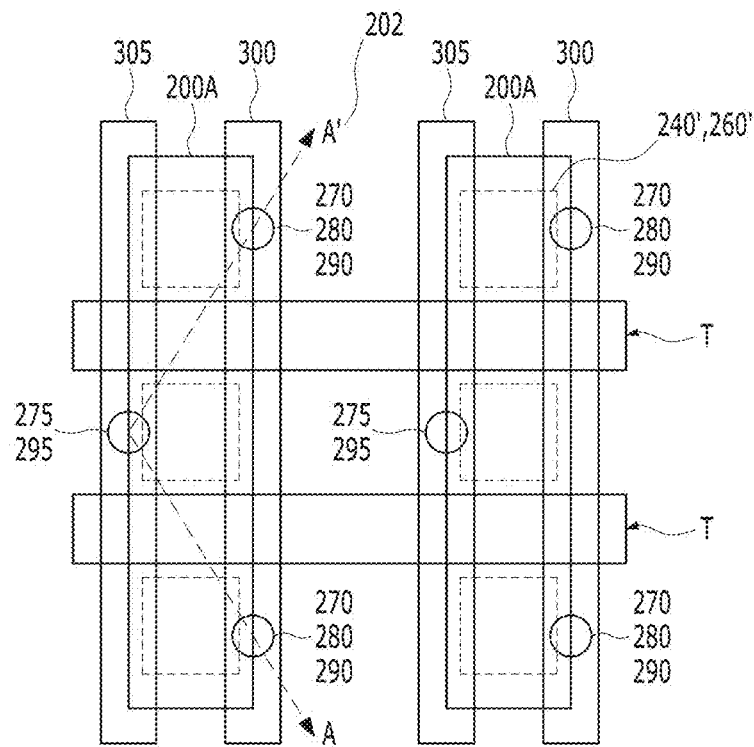
FIG. 9 is a plan view of the semiconductor memory shown in FIG. 8E.

Referring to FIG. 8A, a semiconductor substrate 200 may be provided. The semiconductor substrate 200 may include diverse semiconductor materials such as silicon.

Subsequently, an isolation layer 202 may be formed in the semiconductor substrate 200 to define active regions 200A of the semiconductor substrate 200. The isolation layer 202 may be formed by selectively etching an isolation layer of the semiconductor substrate 200 so as to form an isolation trench and filling the isolation trench with an insulation material, such as a silicon oxide or a silicon nitride.

In this implementation, a plurality of active regions 200A may be arranged in a first direction, which may be a horizontal direction, for example, to be spaced apart from each other. Each of the active regions 200A may have a shape of line stretched in a second direction that intersects with the first direction, which may be a vertical direction, for example. However, it is obvious to those skilled in the art that the shape, number and arrangement of the active regions 200A may be varied.

Subsequently, gate trenches T may be formed by forming a mask pattern (not shown) that exposes regions reserved for gates over the semiconductor substrate 200, etching the active regions 200A and the isolation layer 202 to provide a space where the gates of the transistor are to be formed by using the mask pattern as an etch barrier. In this implementation, each of the gate trenches T may be stretched in the first direction to go across the active regions 200A, and the gate trenches T may be arranged in the second direction to be spaced apart from each other. However, it is obvious to those skilled in the art that the shape, number and arrangement of the gate trenches T may be varied.

Subsequently, a gate dielectric layer 210 may be formed along the internal wall of each gate trench T. The gate dielectric layer 210 may be formed through a thermal oxidation process or a dielectric material deposition process, and it may include a silicon oxide.

Subsequently, a gate electrode 220 may be formed to fill the lower portion of each gate trench T where the gate dielectric layer 210 is formed. The gate electrode 220 may be formed by forming a conductive material such as a metal or a metal oxide over a resultant structure where the gate dielectric layer 210 is formed, and performing an etch-back process until the conductive material reaches a predetermined height.

Subsequently, a gate protective layer 230 may be formed over the gate electrode 220. The gate protective layer 230 may be formed by forming an insulation material that covers the resultant structure where the gate electrode 220 is formed and then performing a planarization process, such as an etch-back process or a Chemical Mechanical Polishing (CMP) process until the upper surface of the semiconductor substrate 200 is exposed. The gate protective layer 230 may be formed of diverse insulation materials, such as a silicon nitride, a silicon oxynitride, or a combination thereof.

Figure 8B:
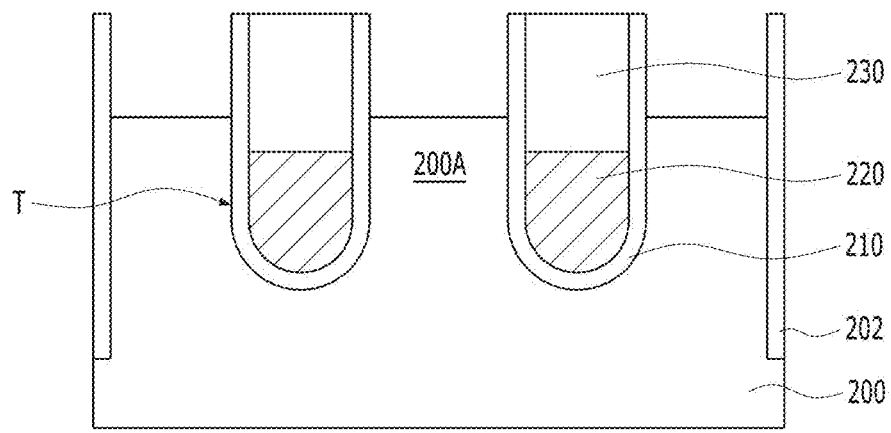

Referring to FIG. 8B, the active regions 200A may be recessed in such a manner that the upper surface of the active regions 200A becomes lower than the upper surface of the gate protective layer 230 by a predetermined length in order to provide a space where landing plug contacts are to be formed.

The active regions 200A may be recessed by using a gas or a chemical having a high etch selectivity from the gate dielectric layer 210 and/or the gate protective layer 230 to selectively remove the active regions 200A.

Although not illustrated, a process of implanting an impurity into the active regions 200A that are exposed by the gate protective layer 230 so as to form junction regions after the process of FIG. 8A and/or the process of FIG. 8B.

Figure 8C:
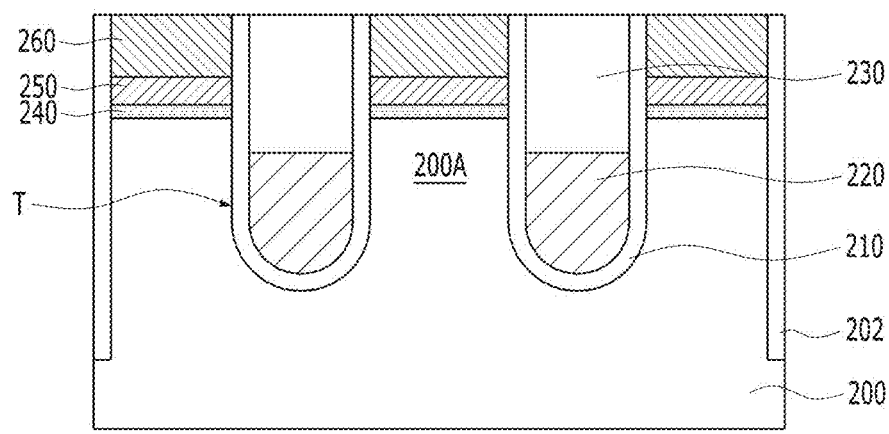

Referring to FIG. 8C, a primary insulation layer 240, a reactive metal layer 250, and a primary capping layer 260 may be sequentially formed in the space formed by the recess of the active regions 200A.

The primary insulation layer 240 may be formed by depositing an insulation material for forming the primary insulation layer 240 on the resultant structure of the process of FIG. 8B, and then removing the upper portion of the insulation material through an etch-back process until the insulation material reaches a predetermined thickness. The reactive metal layer 250 may be formed by depositing a metal substance for forming the reactive metal layer 250 on the resultant structure where the primary insulation layer 240 is formed and then removing the upper portion of the metal substance through an etch-back process until the metal substance reaches a predetermined thickness. The primary capping layer 260 may be formed by depositing a metal nitride for forming the primary capping layer 260 over the resultant structure where the primary insulation layer 240 and the reactive metal layer 250 are formed and then performing a planarization process until the upper surface of the gate protective layer 230 is exposed.

The primary insulation layer 240 may be the thinnest layer and include diverse insulation materials, such as a silicon oxide and a metal oxide that satisfy stoichiometry. The reactive metal layer 250 reactive metal layer 250 may be approximately two to four as thick as the primary insulation layer 240, and include diverse metal substances. The primary capping layer 260 may be the thickest layer. For example, the primary capping layer 260 may be approximately 10 times as thick as the primary insulation layer 240. The primary capping layer 260 may include diverse metal nitrides. Furthermore, the metal of the metal nitride of the primary capping layer 260 and the metal of the reactive metal layer 250 may be the same. In this case, the reactive metal layer 250 and the primary capping layer 260 may be deposited in-situ.

Figure 8D:
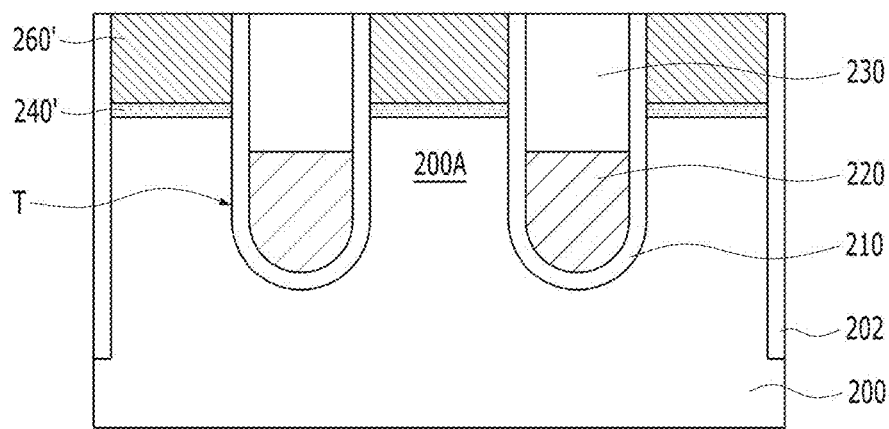
Figure 8E:
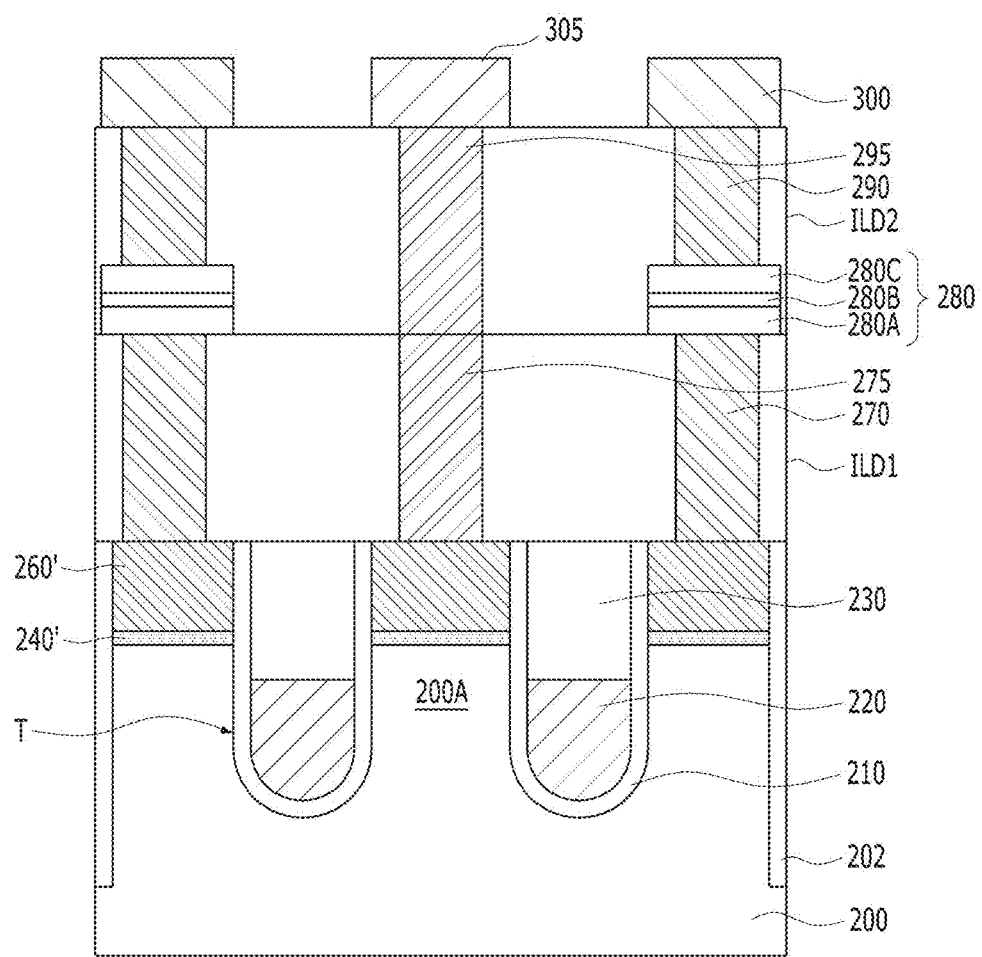
FIG. 8E is a cross-sectional view illustrating a semiconductor memory including the transistor of FIG. 8D.

Referring to FIG. 8D, a thermal treatment may be performed at a high temperature to activate the impurity of the active regions 200A.

As a result of the thermal treatment, the metal substance of the reactive metal layer 250 may diffuse into the primary insulation layer 240 so as to form an insulation layer 240' that includes a bonded structure of the metal of the reactive metal layer 250 and the element included in the primary insulation layer 240. Also, a capping layer 260' may be formed over the insulation layer 240' due to the mutual diffusion of the metal substance of the reactive metal layer 250 and the metal nitride of the primary capping layer 260.

As a result, the M-I-S structure where the insulation layer 240' and the capping layer 260' are stacked over the active regions 200A of the semiconductor substrate 200 may be obtained. The M-I-S structure may function as landing plug contacts for coupling the active regions 200A of the semiconductor substrate 200 with other constituent elements.

The transistor shown in FIG. 8D may be fabricated through the above-described process.

Referring back to FIG. 8D, the transistor in accordance with the implementation may include the gate trenches T that are formed inside the semiconductor substrate 200 including the active regions 200A defined by the isolation layer 202 and stretched in the first direction to go across the active regions 200A, the gate electrodes 220 filling the gate trenches T, and the landing plug contacts 240' and 260' formed in the upper portions of the active regions 200A on both sides of each gate electrode 220. One between the active regions 200A on both sides of each gate electrode 220 may function as a source region, and the other may function as a drain region. Herein, each of the landing plug contacts 240' and 260' may be of a stacked structure of the insulation layer 240' and the capping layer 260'.

According to the transistor and the method for fabricating the transistor described above, it is possible to suppress the formation of a metal-semiconductor compound such as a metal silicide between the insulation layer 240' and the active regions 200A and/or between the capping layer 260' and the active regions 200A. Therefore, the loss of impurity from the active regions 200A may be prevented, which eventually reduces the contact resistance of the transistor.

Although the gate electrode 220 is illustrated to fill the inside of the semiconductor substrate 200 in this implementation, the gate electrode 220 may be formed otherwise according to another implementation of the present disclosure. For example, there may be a transistor where a portion of a gate electrode fills a semiconductor substrate and the other portion of the gate electrode is protruded over the semiconductor substrate. Also, a transistor may be formed to have its entire gate electrode protruded over the semiconductor substrate.

Meanwhile, the transistor of FIG. 8D may be used as an access device for an access to a memory element in diverse semiconductor memories. Particularly, the transistor may be coupled with a memory device requiring a high driving current, such as a resistive variable device, e.g., a magnetoresistive element, which requires a high level of current when a switching is carried out between a high resistance state and a low resistance state. This will be described below in detail with reference to FIGS. 8E and 9 by taking examples.

Referring to FIGS. 8E and 9, a semiconductor memory in accordance with an implementation may include a resistive variable device 280, bit lines 300, and a source line 305. A lower portion of the resistive variable device 280 is coupled with the landing plug contacts 240' and 260' on both sides of the two gate electrode 220 neighboring in the second direction, which corresponds to one end of the transistor shown in FIG. 8D. The bit lines 300 are coupled with an upper portion of the resistive variable device 280 individually. The source line 305 has its lower portion coupled with the landing plug contact 240' and 260' disposed between two gate electrodes 220 that are adjacent to each other in the second direction, which is another end of the transistor shown in FIG. 8D.

In some implementations, a first inter-layer dielectric layer ILD1 may be formed over the resultant structure obtained from the process of FIG. 8D. In the inside of the first inter-layer dielectric layer ILD1, first and second lower contacts 270 and 275 penetrating through the first inter-layer dielectric layer ILD1 and coupled with the landing plug contacts 240' and 260' may be formed. The first lower contact 270 may be formed over a landing plug contact 240' and 260' that is coupled with a drain region between the active regions 200A on both sides of the gate electrode 220, and the second lower contact 275 may be formed over a landing plug contact 240' and 260' that is coupled with a source region between the active regions 200A on both sides of the gate electrode 220. Herein, the first lower contact 270 may be formed to be one-sided toward one side of each active region 200A in the first direction. For example, the first lower contact 270 may be formed to be one-sided toward the right side of each active region 200A. Conversely, the second lower contact 275 may be formed to be one-sided toward another side of each active region 200A in the first direction. For example, the second lower contact 275 may be formed to be one-sided toward the left side of each active region 200A. This is to secure a distance between the resistive variable device 280, a first upper contact 290 and the bit lines 300 which are to be coupled with the first lower contact 270 and a second upper contact 295 and the source line 305 which are to be coupled with the second lower contact 275.

Formed over the first inter-layer dielectric layer ILD1 may be a memory element coupled with the first lower contacts 270, such as the resistive variable device 280.

The resistive variable device 280 is capable of switching between different resistance states according to the voltage or current applied thereto through the transistor that is coupled with its lower portion and the bit line 300 that is coupled with its upper portion. The resistive variable device 280 may be formed as a single layer or a multi-layer which includes diverse materials used for an RRAM (resistive random access memory), a PRAM (phase change random access memory), an FRAM (ferroelectric random access memory), or an MRAM, etc. For example, the diverse materials may include metal oxides such as transition metal oxides and perovskite-based materials, phase-change materials such as chalcogenide-based materials, ferroelectric materials, and ferromagnetic materials. The resistive variable device 280 may store different data according to the resistance states.

In this implementation, the resistive variable device 280 may include a magnetic tunnel junction (MTJ) structure which includes a pinned layer 280A having a fixed magnetization direction, a free layer 280C having a variable magnetization direction, and a tunnel barrier layer 280B that is interposed between the pinned layer 280A and the free layer 280C. Each of the pinned layer 280A and the free layer 280C may have a structure of a single layer or a multi-layer that includes a ferromagnetic material, such as Fe—Pt alloy, Fe—Pd alloy, Co—Pd alloy, Co—Pt alloy, Fe—Ni—Pt alloy, Co—Fe—Pt alloy, Co—Ni—Pt alloy, or Co—Fe—B alloy. The position of the pinned layer 280A and the free layer 280C may be switched into each other. The tunnel barrier layer 280B changes the magnetization direction of the free layer 280C by having electrons go through tunneling during a write operation for storing a data in a memory cell. The tunnel barrier layer 280B may have a structure of a single layer or a multi-layer that includes MgO, CaO, SrO, TiO, VO or NbO. When the magnetization direction of the free layer 280C and the magnetization direction of the pinned layer 280A are in parallel, the resistive variable device 280 may be in a low resistance state. When the magnetization direction of the free layer 280C and the magnetization direction of the pinned layer 280A are in antiparallel, the resistive variable device 280 may be in a high resistance state. Different data may be stored due to the different resistance states.

The present disclosure, however, is not limited to this implementation, and it is obvious to those skilled in the art that one of a transistor may be coupled with diverse memory devices capable of storing data, other than the resistive variable device 280.

A second inter-layer dielectric layer ILD2 may be formed over the resistive variable device 280 and the first inter-layer dielectric layer ILD1. In the inside of the second inter-layer dielectric layer ILD2, the first upper contact 290 coupled with the upper portion end of the resistive variable device 280 and the second upper contact 295 coupled with the second lower contact 275 may be formed.

Over the second inter-layer dielectric layer ILD2, the bit lines 300, which are stretched in the second direction and coupled with the first upper contacts 290 arranged in the second direction, and the source line 305, which are stretched in the second direction and coupled with the second upper contact 295 arranged in the second direction, may be formed.

Since the semiconductor memory described above may be fabricated including the transistor whose capability is improved as described above, the operation characteristics of the semiconductor memory may be improved.

The above and other memory circuits or semiconductor devices based on the disclosed technology can be used in a range of devices or systems. FIGS. 10-14 provide some examples of devices or systems that can implement the memory circuits disclosed herein.

Figure 10:
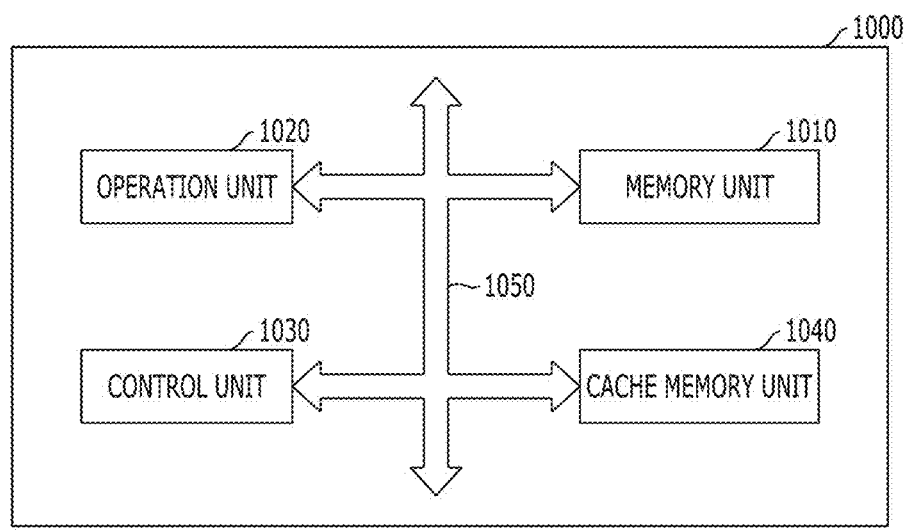
FIG. 10 is an example of configuration diagram of a microprocessor implementing memory circuitry based on the disclosed technology.

FIG. 10 is an example of configuration diagram of a microprocessor implementing memory circuitry based on the disclosed technology.

Referring to FIG. 10, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

At least one of the memory unit 1010, the operation unit 1020 and the control unit 1030 may include one or more of the above-described semiconductor devices in accordance with the implementations. For example, at least one of the memory unit 1010, the operation unit 1020 and the control unit 1030 may include a metal-insulator-semiconductor (M-I-S) structure that includes: a semiconductor layer; an insulation layer disposed over the semiconductor layer and including a metal; and a conductive layer disposed over the insulation layer and including the same metal as the metal included in the insulation layer. Through this, operating characteristics of at least one of the memory unit 1010, the operation unit 1020 and the control unit 1030 may be improved. As a consequence, operating characteristics of the microprocessor 1000 may be improved.

Figure 11:
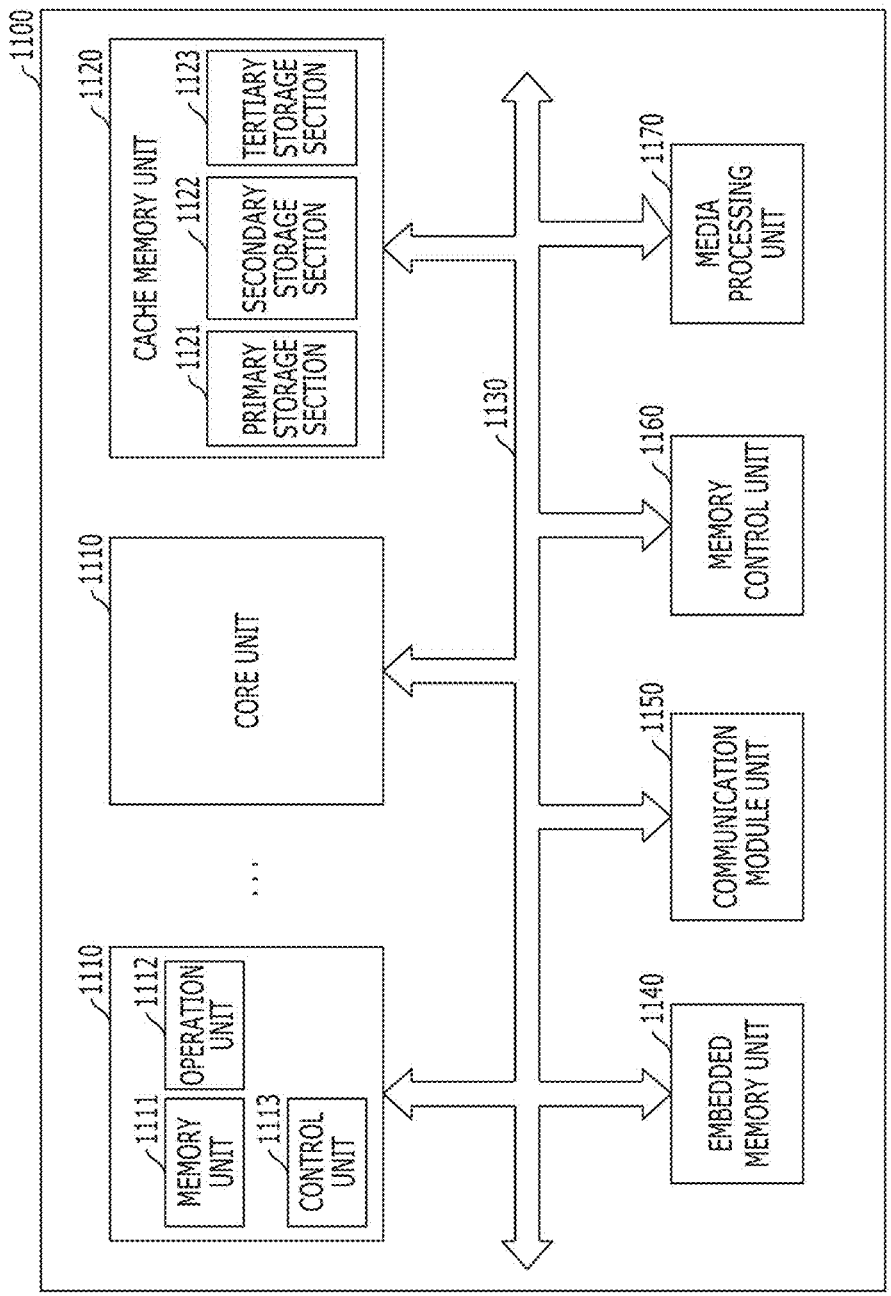
FIG. 11 is an example of configuration diagram of a processor implementing memory circuitry based on the disclosed technology.

FIG. 11 is an example of configuration diagram of a processor implementing memory circuitry based on the disclosed technology.

Referring to FIG. 11, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest.

Although it was shown in FIG. 11 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120.

The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

At least one of the cache memory unit 1120, the core unit 1110 and the bus interface 1130 may include one or more of the above-described semiconductor devices in accordance with the implementations. For example, at least one of the cache memory unit 1120, the core unit 1110 and the bus interface 1130 may include a metal-insulator-semiconductor (M-I-S) structure that includes: a semiconductor layer; an insulation layer disposed over the semiconductor layer and including a metal; and a conductive layer disposed over the insulation layer and including the same metal as the metal included in the insulation layer. Through this, operating characteristics of at least one of the cache memory unit 1120, the core unit 1110 and the bus interface 1130 may be improved. As a consequence, operating characteristics of the processor 1100 may be improved.

Figure 12:
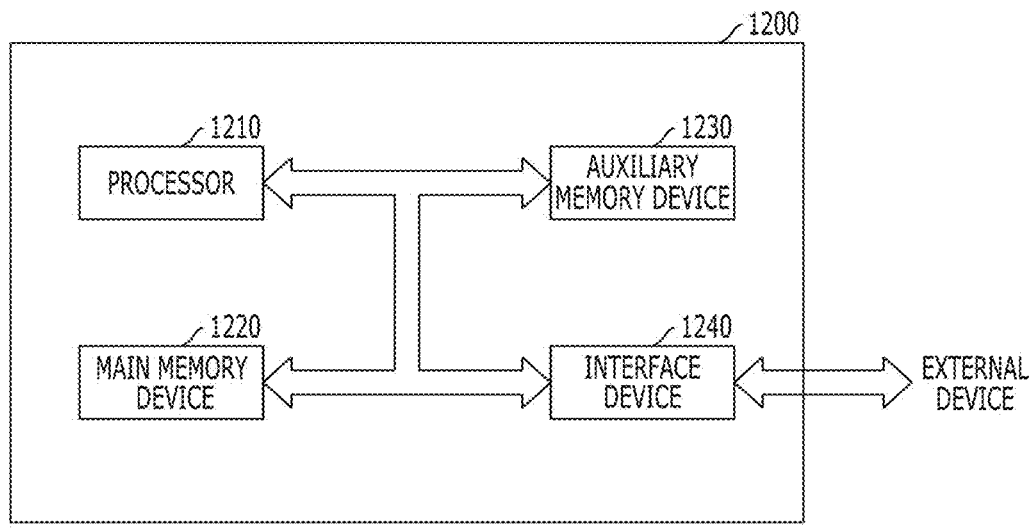
FIG. 12 is an example of configuration diagram of a system implementing memory circuitry based on the disclosed technology.

FIG. 12 is an example of configuration diagram of a system implementing memory circuitry based on the disclosed technology.

Referring to FIG. 12, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

At least one of the processor 1210, the main memory device 1220, the auxiliary memory device 1230 and the interface device 1240 may include a metal-insulator-semiconductor (M-I-S) structure that includes: a semiconductor layer; an insulation layer disposed over the semiconductor layer and including a metal; and a conductive layer disposed over the insulation layer and including the same metal as the metal included in the insulation layer. Through this, operating characteristics of at least one of the processor 1210, the main memory device 1220, the auxiliary memory device 1230 and the interface device 1240 may be improved. As a consequence, operating characteristics of the system 1200 may be improved.

Figure 13:
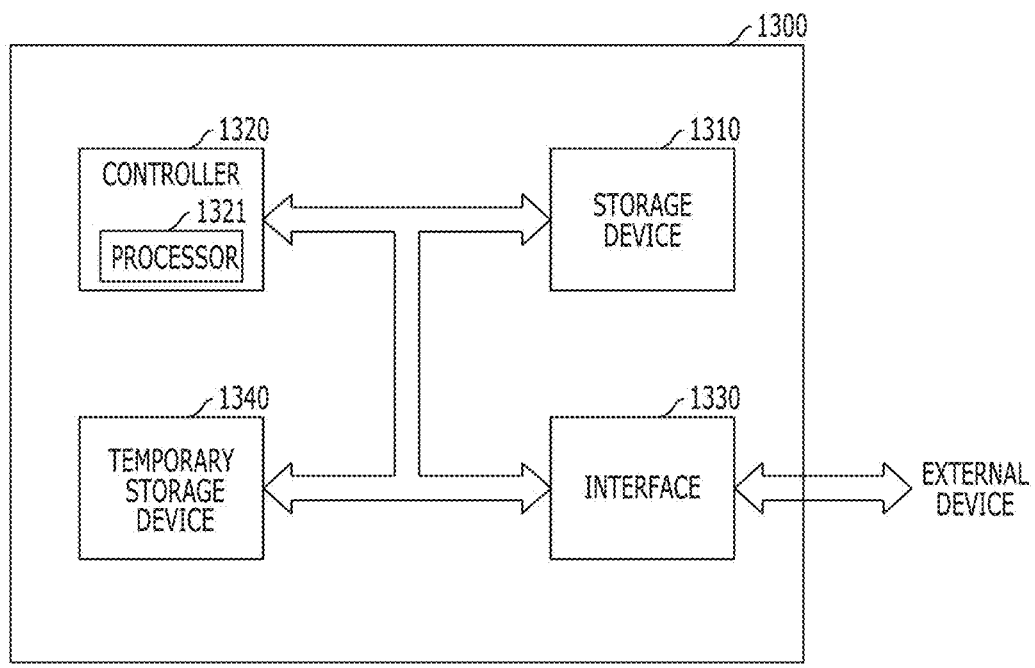
FIG. 13 is an example of configuration diagram of a data storage system implementing memory circuitry based on the disclosed technology.

FIG. 13 is an example of configuration diagram of a data storage system implementing memory circuitry based on the disclosed technology.

Referring to FIG. 13, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system.

At least one of the storage device 1310, the controller 1320, the interface 1330 and the temporary storage device 1340 may include one or more of the above-described semiconductor devices in accordance with the implementations. For example, at least one of the storage device 1310, the controller 1320, the interface 1330 and the temporary storage device 1340 may include a metal-insulator-semiconductor (M-I-S) structure that includes: a semiconductor layer; an insulation layer disposed over the semiconductor layer and including a metal; and a conductive layer disposed over the insulation layer and including the same metal as the metal included in the insulation layer. Through this, operating characteristics of at least one of the storage device 1310, the controller 1320, the interface 1330 and the temporary storage device 1340 may be improved. As a consequence, operating characteristics of the data storage system 1300 may be improved.

Figure 14:
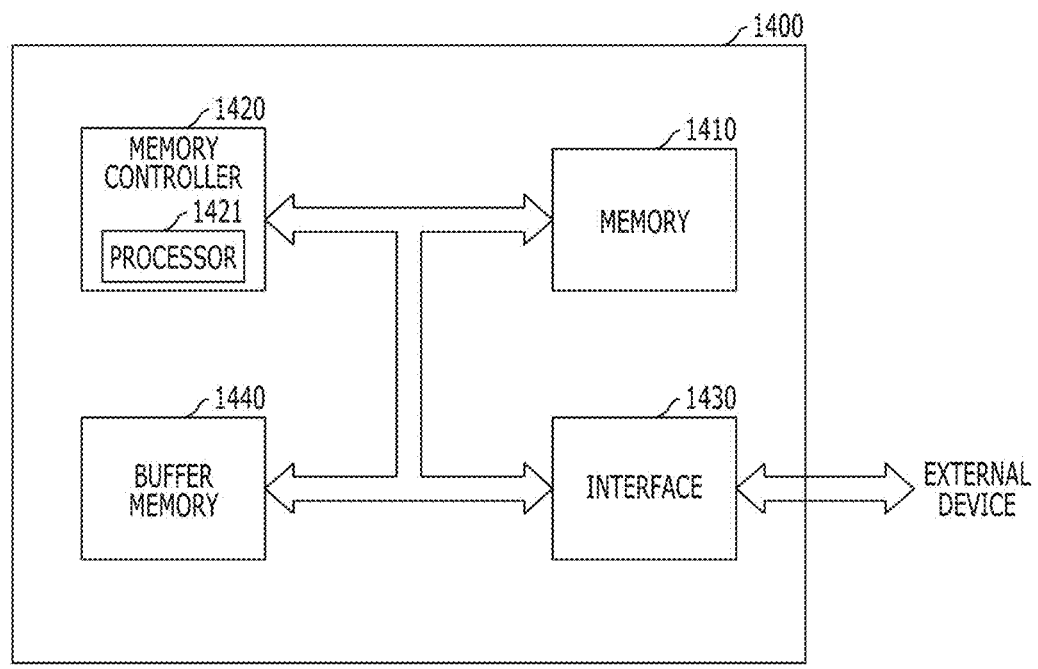
FIG. 14 is an example of configuration diagram of a memory system implementing memory circuitry based on the disclosed technology.

FIG. 14 is an example of configuration diagram of a memory system implementing memory circuitry based on the disclosed technology.

Referring to FIG. 14, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

At least one of the memory 1410, the memory controller 1420, the interface 1430 and the buffer memory 1440 may include one or more of the above-described semiconductor devices in accordance with the implementations. For example, at least one of the memory 1410, the memory controller 1420, the interface 1430 and the buffer memory 1440 may include a metal-insulator-semiconductor (M-I-S) structure that includes: a semiconductor layer; an insulation layer disposed over the semiconductor layer and including a metal; and a conductive layer disposed over the insulation layer and including the same metal as the metal included in the insulation layer. Through this, operating characteristics of at least one of the memory 1410, the memory controller 1420, the interface 1430 and the buffer memory 1440 may be improved. As a consequence, operating characteristics of the memory system 1400 may be improved.

Features in the above examples of electronic devices or systems in FIGS. 10-14 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device that includes a metal-insulator-semiconductor (M-I-S) structure, comprising:
    providing a semiconductor layer;
    forming a primary insulation layer of a first thickness over the semiconductor layer;
    forming a reactive metal layer of a second thickness over the primary insulation layer, wherein the second thickness is greater than the first thickness;
    forming a primary capping layer of a third thickness over the reactive metal layer, wherein the third thickness is greater than the second thickness; and
    performing a thermal treatment.

2. The method of claim 1, wherein the second thickness is approximately two to four times as thick as the first thickness.

3. The method of claim 1, wherein the second thickness is approximately three times as thick as the first thickness.

4. The method of claim 1, wherein the primary capping layer includes a metal nitride.

5. The method of claim 1, wherein the primary capping layer includes a nitride of a metal which is the same as a metal included in the reactive metal layer.

6. The method of claim 5, wherein the forming of the reactive metal layer and the forming of the primary capping layer are performed in-situ.

7. The method of claim 1, wherein the performing of the thermal treatment includes causing the primary insulation layer to change into an insulation layer that further includes a metal of the reactive metal layer.

8. The method of claim 7, wherein the primary insulation layer includes an insulation material that satisfies stoichiometry, and
    the insulation layer includes an insulation material that does not satisfy stoichiometry.

9. The method of claim 1, wherein the performing of the thermal treatment includes causing the primary capping layer to change into a capping layer that further includes a metal of the reactive metal layer.

10. The method of claim 1, wherein the semiconductor layer includes silicon,
    the primary insulation layer includes a silicon oxide,
    the reactive metal layer includes titanium, and
    the primary capping layer includes a titanium nitride.

11. The method of claim 1, further comprising, after the providing of the semiconductor layer:
    forming a gate electrode that is isolated from the semiconductor layer by a gate dielectric layer, wherein the gate electrode is disposed over the semiconductor layer or at least a portion of the gate electrode is buried in the semiconductor layer; and
    forming a junction region by implanting an impurity into the semiconductor layer that is exposed by the gate electrode,
    wherein the primary insulation layer, the reactive metal layer, and the primary capping layer are formed over the junction region.

12. The method of claim 11, further comprising:
    forming a memory device that is coupled with the primary capping layer over the primary capping layer.

13. An electronic device, comprising:
    a metal-insulator-semiconductor (M-I-S) structure that comprises:
        a semiconductor layer;
        an insulation layer disposed over the semiconductor layer and including a metal; and
        a conductive layer disposed over the insulation layer and including the same metal as the metal included in the insulation layer,
        wherein the insulation layer includes a silicon oxide including a metal, and wherein the metal in the insulation layer exists in a form of an oxide that does not satisfy stoichiometry.

14. The electronic device of claim 13, wherein the conductive layer includes a metal nitride.

15. The electronic device of claim 13, wherein the conductive layer includes a nitride of the same metal included in the insulation layer.

16. The electronic device of claim 13, wherein a metal-semiconductor compound does not exist between the semiconductor layer and the insulation layer and between the semiconductor layer and the conductive layer.

17. The electronic device of claim 13, wherein the semiconductor layer includes silicon, the metal includes titanium, and the conductive layer includes a titanium nitride.

18. The electronic device of claim 13, wherein the insulation layer includes less oxygen than an amount of oxygen that is required to satisfy stoichiometry.

19. An electronic device, comprising:
a metal-insulator-semiconductor (M-I-S) structure that comprises:
a semiconductor layer;
an insulation layer disposed over the semiconductor layer and including a metal; and
a conductive layer disposed over the insulation layer and including the same metal as the metal included in the insulation layer
a transistor, which includes:
a gate electrode that is coupled with the semiconductor layer with a gate dielectric layer therebetween;
a junction region that is formed inside the semiconductor layer on one side of the gate electrode; and
a stacked structure of the insulation layer and the conductive layer that is coupled with the junction region over the junction region.

20. The electronic device of claim 19, further comprising:
a memory device that is coupled with the stacked structure over the stacked structure.

* * * * *